(12) United States Patent
Mueller-Weinfurtner et al.

(10) Patent No.: US 8,995,583 B2
(45) Date of Patent: Mar. 31, 2015

(54) DECODING TECHNIQUE FOR TAIL-BITING CODES

(75) Inventors: Stefan Mueller-Weinfurtner, Nürnberg (DE); Matthias Kamuf, München (DE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 17 days.

(21) Appl. No.: 13/810,547

(22) PCT Filed: Jul. 30, 2010

(86) PCT No.: PCT/EP2010/004682
§ 371 (c)(1),
(2), (4) Date: Jan. 16, 2013

(87) PCT Pub. No.: WO2012/013211
PCT Pub. Date: Feb. 2, 2012

(65) Prior Publication Data
US 2013/0114766 A1   May 9, 2013

(51) Int. Cl.
*H04L 27/06* (2006.01)
*H04L 1/00* (2006.01)
(Continued)

(52) U.S. Cl.
CPC ......... *H04L 1/0054* (2013.01); *H03M 13/3994* (2013.01); *H03M 13/413* (2013.01); *H03M 13/6525* (2013.01)
USPC ........... 375/341; 375/362; 375/316; 375/320; 375/324; 375/340

(58) Field of Classification Search
CPC ... H04L 1/0054; H04L 1/0059; H04L 1/0071; H03M 13/413; H03M 13/3938; H03M 13/3961; H03M 13/3988; H03M 13/41; H03M 13/4107; H03M 13/6325; H03M 13/6362; H03M 13/6502; H03M 13/6505; H03M 13/6508
USPC ......... 375/262, 295, 299, 316, 317, 320, 322, 375/328, 339, 340, 341, 342, 343, 346, 350
See application file for complete search history.

(56) References Cited

U.S. PATENT DOCUMENTS 6,877,132 B1 * 4/2005 De et al. ......................... 714/795
6,990,092 B1 * 1/2006 Siala ............................. 370/347
(Continued)

FOREIGN PATENT DOCUMENTS

EP            2131502 A2      12/2009
WO         2008027613 A2       3/2008
WO      WO 2009132945 A1 *   11/2009

OTHER PUBLICATIONS

Howard H.; On Tail Biting Convolutional Codes; IEEE Feb. 1986; pp. 104-111, total 8 pages.*
(Continued)

*Primary Examiner* — Hirdepal Singh
(74) *Attorney, Agent, or Firm* — Coats & Bennett, P.L.L.C.

(57) ABSTRACT

A technique for decoding a signal in a communication network is provided. A method implementation of the technique comprises the steps of receiving a signal; identifying a position in the signal; initializing a Viterbi state metric; and decoding the encoded signal by means of a wrap-around Viterbi algorithm. The received signal comprises information, wherein the signal is encoded by a tail-biting convolutional code. The identified position relates to a known portion of the information. The initialized Viterbi state metric is consistent with the known portion of the information. The decoding uses the initial Viterbi state metric, wherein the decoding starts at a decoding step following the identified position.

12 Claims, 4 Drawing Sheets

(51) Int. Cl.
*H03M 13/39* (2006.01)
*H03M 13/41* (2006.01)
*H03M 13/00* (2006.01)

(56) References Cited

U.S. PATENT DOCUMENTS

| | | | |
|---|---|---|---|
| 7,983,363 B2* | 7/2011 | Jayaraman et al. | 375/341 |
| 8,483,327 B2* | 7/2013 | Schmidl et al. | 375/341 |
| 2001/0000706 A1* | 5/2001 | Butler et al. | 375/340 |
| 2005/0280568 A1* | 12/2005 | Rowland et al. | 341/155 |
| 2008/0056400 A1* | 3/2008 | Hedayat et al. | 375/265 |
| 2009/0041166 A1* | 2/2009 | Patel et al. | 375/341 |
| 2009/0103659 A1* | 4/2009 | Chen et al. | 375/341 |
| 2010/0169747 A1* | 7/2010 | Chen et al. | 714/781 |
| 2011/0099455 A1* | 4/2011 | Kamuf | 714/755 |
| 2011/0211659 A1* | 9/2011 | Kosakowski | 375/341 |

OTHER PUBLICATIONS

Shao, R. et al., "Two Decoding Algorithms for Tailbiting Codes", IEEE Transactions on Communications, Oct. 2003, pp. 1658-1665, vol. 51, No. 10, IEEE Service Center, USA, XP11102444.

* cited by examiner

DECODING TECHNIQUE FOR TAIL-BITING CODES

TECHNICAL FIELD

The present disclosure generally relates to a decoding technique for tail-biting codes. In particular, the disclosure relates to a method and an apparatus for decoding signals encoded by a tail-biting error-correcting code, particularly a tail-biting convolutional code.

BACKGROUND

Error-correcting codes are means of Forward Error Correction (FEC) frequently used for transmission or storage of payload data. An error-correcting code adds redundancy to the payload data resulting in transport data. The redundancy may allow averaging out noise or compensating for shot noise introduced into the transport data by the transmission channel. In the case of data recording, such as a magnetic recording channel, the redundancy may allow compensating a burst error caused by at least one of writing, storage, and reading.

Error-correcting codes encompass convolutional codes and block codes, such as turbo codes, which may involve a convolutional code as well. In order to convolutionally encode the payload data, a shift register of an encoder is regularly set to an initial state. The initial state can be zero-valued for terminated convolutional codes or "tail-biting" for tail-biting convolutional codes. A tail-biting initial state is typically equal to a final state of the register. Both termination and tail-biting turn the convolutional code into a block code. As opposed to terminated convolutional codes, any possible register state may be the tail-biting initial state, which typically varies from transport block to transport block in a way unpredictable for a receiver.

On the receiver side, terminated convolutional codes can be rapidly decoded based on the known zero-valued initial state at the price of a fractional rate loss, since a number of zero bits (equal to or greater than the register bit length) has to be appended to the payload data. Tail-biting convolutional codes avoid such fractional rate loss. Tail-biting is particularly valuable in applications, such as packet transmission, in which transport blocks are apt to be short.

Modern mobile communication standards, including Long-Term Evolution (LTE), stipulate a tail-biting convolutional code to encode Downlink Control Information (DCI) transmitted on a Physical Downlink Control Channel (PDCCH) and a Master Information Block (MIB) transmitted on a Physical Broadcast Channel (PBCH). Besides the FEC provided by the convolutional code, the DCI is error-protected by a 16-bit Cyclic Redundancy Check (CRC). Since the size of the DCI may significantly vary in bit length, filling bits ensure that the payload data fulfills format constraints prescribed by the standard.

The price for avoiding the rate loss compared to terminated convolutional codes is an increased decoding complexity of the tail-biting convolutional codes. Decoding a signal encoded by a tail-biting convolutional code requires iterating a Viterbi algorithm several times until a tail-biting condition is fulfilled, whereas a signal encoded by a terminated convolutional code is decodable by a single run of the Viterbi algorithm. Computational complexity on the receiver side thus multiplies by at least the number of iterations of the Viterbi algorithm. Particularly under poor channel conditions, the Viterbi iterations may even fail to converge to a Viterbi path fulfilling the tail-biting condition, causing loss of the payload data.

SUMMARY

Accordingly, a technique is needed for decoding a signal encoded by a tail-biting code that reduces complexity and/or improves reliability.

According to a first aspect, a method of decoding a signal in a communication network is provided. The method comprises the steps of receiving a signal; identifying a position in the signal; initializing a Viterbi state metric; and decoding the encoded signal. The received signal comprises information encoded by a tail-biting convolutional code. The identified position relates to a known portion of the information. The initialized Viterbi state metric is consistent with the known portion of the information. The decoding utilizes a Wrap-Around Viterbi Algorithm (WAVA) based on the initialized Viterbi state metric and starts with (or at) a decoding step essentially following the identifying position.

The starting decoding step (i.e., the decoding step with/at which the decoding starts) can thus process the signal at an initial position of the decoding depending on the identified position relating to the known portion. It is possible to optimize the starting decoding step (or the initial position) based on the identified position relating to the known portion. It is also possible to optimize the initial Viterbi state metric (initializing the WAVA) based on the at least partial knowledge of the known portion. As an advantage, the WAVA can decode the signal more rapidly by requiring less iterations. As another or a further advantage, the WAVA may successfully decode the signal even under poor channel conditions (such as a noise level critical for the convergence of the WAVA).

The starting decoding step (or the initial position) can be a first decoding step (respectively, a first initial position) that is preferably first in a direction of the decoding and does not or not exclusively relate to (or process) the known portion. The tail-biting convolutional code can be a cyclic code. The WAVA can be a conditional iteration of a Viterbi algorithm for a (continuous) cyclic update of a Viterbi state metric.

At least one of encoding, transmitting and receiving of the signal may start at a position relating to a beginning of the information, such as a leading bit, a least significant bit, or a most significant bit of the information. The identified position can be independent of the beginning of the information. The initial position can be different from the beginning of the information.

The identified position can indicate one or more decoding steps relating to (or processing) the known portion. Particularly, the identified position can indicate a last decoding step relating to (or processing) the known portion. The initial position can indicate a first decoding step following the known portion. The initial position can essentially follow the identified position. Particularly, the initial position can indicate a first decoding step following the identified position. Specifically, the identified position can indicate a last bit in the decoding direction of the known portion. The initial position can indicate a first unknown bit following (in the decoding direction) the known portion.

Alternatively, the identified position can indicate the starting decoding step. In this case, the identified position can be equal to the initial position. Particularly, requiring that the decoding starts with or at the decoding step essentially "following the identifying position" can encompass that the decoding starts (with the starting decoding step) at the identified position.

The terms "known" and "knowledge" in particular, but not exclusively, refer to a priori knowledge, such as knowledge available prior to the decoding of the signal (as a temporal condition or a causal condition). Particularly, the known portion may be known based on a communication standard or any other technical standard. Furthermore, the terms "known" and "knowledge" may refer to knowledge available at the receiver side (e.g., at a receiver, at a decoder, or at any other receiving network component). Throughout, the terms "known" and "knowledge" can refer to certainty, such as predetermined or predefined bit values, or probabilistic knowledge, such as a probability distribution (for bit values of the known portion).

The known portion can comprise one or more filling bits of known value, a known protocol code word, or any other known bit pattern. The known portion can be completely known. Complete knowledge means that all bits of the known portion are known. Particularly, the known portion can exclusively comprise one or more known bits. Alternatively, the known portion can be partially known. Partial knowledge may encompass that one or more (but not all) bits of the known portion are known. Particularly, the known portion can comprise a (e.g., consecutive) sequence of bits (such as a bit string) including both unknown bits and one or more known bits. Alternatively or additionally, partial knowledge may encompass statistical inference of the initial Viterbi state metric based on the known portion (and other factors such as channel coefficients).

The initial Viterbi state metric can exclude initial Viterbi states that are inconsistent with the known portion of the information. Preferably, a zero probability, or very low log probability, is assigned to inconsistent initial Viterbi states. Excluding inconsistent initial Viterbi states (by the initializing of the initial Viterbi state metric) can significantly reduce a search space and thereby computational complexity of the decoding.

The convolutional code can be recursive or non-recursive. For a non-recursive convolutional code, the consistency (or inconsistency) may require (respectively, exclude) one or more bit values (in the initial Viterbi state) relating to the known portion of the information. In the initializing of the initial Viterbi state metric, requiring (the one or more bit values of) consistent initial Viterbi states or excluding (the one or more bit values of) inconsistent initial Viterbi states is preferably implemented by bit masking utilizing a bit mask.

The initial Viterbi state metric may be or may represent a uniform distribution (or equal distribution) of initial Viterbi states that are consistent with the known portion of the information. Equal probabilities can be assigned to (all) initial Viterbi states consistent with the known portion. A uniform (e.g., log) probability distribution (restricted to the consistent initial Viterbi states) can provide an optimal initialization of the WAVA, which can minimize decoding time and complexity.

The known portion of the information can comprise one or more consecutive bits of the information. Alternatively, the known portion of the information can comprise a (e.g., discontinuous, not consecutive or not connected) subset of a bit string of the information. The initial Viterbi state metric can thus account for knowledge on a bit level, including one or more filling bits or any other predefined bit value defined by the communication standard.

The convolutional code can have a memory length m (referred to as the "memory" of the convolutional code). The memory can correspond to a number of register stages in a shift register for encoding by the tail-biting convolutional code. Alternatively or equivalently, the memory can correspond to a binary logarithm (with base 2) of the number of Viterbi states (of an encoder or the decoder). The length of the bit string can be equal to or shorter than the memory of the convolutional code. This may allow to fully incorporate the known portion of the information in the initialized Viterbi state metric.

Alternatively or in addition, the known portion can comprise a number M of known consecutive bits, wherein M exceeds the memory m of the convolutional code. A decoding step can involve a decision for a Viterbi branch. A number of M-m (corresponding to the difference of known consecutive bits and the memory) decoding steps (or branch decisions) out of the last M decoding steps of the Viterbi algorithm can be predetermined (in each iteration for the WAVA). The predetermined decoding step can have a predetermined Viterbi branch. The predetermined Viterbi branch is at least one of consistent with the known portion and independent of the received signal. A Viterbi branch metric of the last M decoding steps can exclude an inconsistent Viterbi branch by assigning a zero probability (or very low log probability) to the inconsistent Viterbi branch.

The WAVA is preferably an iteration of the Viterbi algorithm. The iteration may be cyclic. The decoding can comprise repeating the WAVA (i.e., cyclically iterating the Viterbi algorithm) until a termination condition is fulfilled. The Viterbi algorithm can comprise an updating phase that updates a Viterbi state metric according to the Viterbi branch decisions. The Viterbi algorithm can further comprise a traceback phase that determines a Viterbi path based on the Viterbi branch decisions.

An initial Viterbi state metric of a repeated WAVA (i.e., a following iteration of the Viterbi algorithm) can be equal to a final Viterbi state metric of a previous WAVA (i.e., a previous iteration of the Viterbi algorithm).

The Viterbi state metric can be stored in a metric memory (e.g., as a component of the decoder). The initializing can initialize the metric memory according to the initial Viterbi state metric. The decoding can update in the updating phase the metric memory. The metric memory can be overwritten by at least one of the updated Viterbi state metric (in each updating step) and the final Viterbi state metric (of each WAVA, i.e. of each iteration). The updating of the Viterbi state metric in the WAVA may thus be performed by the same updating component or by several equivalent updating components in all decoding steps.

The termination condition can comprise a tail-biting condition. The tail-biting condition can require that for the terminating WAVA a maximum likelihood state of the final Viterbi state metric corresponds to a tail-biting path in the traceback phase.

Alternatively or in addition, the tail-biting condition can require for the terminating WAVA that a maximum likelihood state of the initial Viterbi state metric equals a maximum likelihood state of the final Viterbi state metric. The termination condition can further require the maximum likelihood state of at least one of the initial Viterbi state metric and the final Viterbi state metric to be consistent with the known portion of the information.

As a further alternative or in addition, the termination condition can comprise a predefined maximum number of repetitions (i.e., iterations of the Viterbi algorithm). Upon reaching the predefined maximum number of repetitions, the signal can be decoded (in the traceback phase) based on the maximum likelihood state of the final Viterbi state metric of the terminating WAVA.

The decoding, particularly the traceback phase, can further comprise determining a maximum likelihood state of at least one of the initial Viterbi state metric and the final Viterbi state metric (of the same iteration). The determination of the maximum likelihood state can be restricted to consider only Viterbi states consistent with the known portion of the information. The traceback phase, particularly the determination of the Viterbi path, can be based on the determined maximum likelihood state of at least one of the initial Viterbi state metric and the final Viterbi state metric (of the same iteration).

Alternatively or in addition, the determination of the maximum likelihood state can be restricted to final Viterbi states fulfilling the tail-biting condition (in the traceback phase). The decoding can thus provide the information (with maximum likelihood) based on both the received signal and the known portion of the information. The decoded signal may thus not simply be corrected based on the known portion of the information. Rather, the known portion of the information can directly enter the method of decoding for an enhanced maximum likelihood decoding result.

According to another aspect, a computer program product is provided. The computer program product comprises program code portions for performing one or more of the steps of one or more of the methods described herein when the program code portions are executed on one or more computing devices. The computer program product may be stored on a computer-readable recording medium such as permanent or re-writable memory, particularly non-volatile memory such as flash memory, or an optical disc storage medium. The computer program product may also be provided for download via one or more computer networks, such as the Internet, a cellular telecommunications network, or a wireless or wired Local Area Network (LAN).

According to a further aspect, an apparatus (e.g., network component) for decoding a signal in a communication network is provided. The communication network can be a mobile communication network. The apparatus comprises a receiver and a decoder. The decoder is adapted to receive a signal comprising information. The signal is encoded by a tail-biting convolutional code. The decoder is adapted to identify a position in the signals related to a known portion of the information, to initialize a Viterbi state metric consistent with the known portion of the information, and to decode the encoded signal by means of a Wrap-Around Viterbi Algorithm (WAVA) using the initialized Viterbi state metric. The decoding starts with (or at) a decoding step (essentially) following the identified position.

The initial Viterbi state metric can exclude initial Viterbi states inconsistent with the known portion of the information. Alternatively or in addition, the initial Viterbi state metric can represent a uniform distribution among initial Viterbi states consistent with the known portion of the information.

The apparatus may be comprised by a user equipment or terminal device such as a mobile telephone, a network or data card, a notebook computer, and so on.

BRIEF DESCRIPTION OF THE DRAWINGS

In the following, the present invention will be described in more detail with reference to exemplary embodiments illustrated in the drawings, wherein FIG. 1 schematically illustrates a mobile communication network comprising an apparatus embodiment incorporated in a network component.

DETAILED DESCRIPTION

In the following description, for purposes of explanation and not limitation, specific details are set forth, such as specific network component configurations and specific communication scenarios in order to provide a thorough understanding of the technique disclosed herein. It will be apparent to one of skill in the art that the techniques may be practiced in other embodiments that depart from these specific details. For example, while the following embodiments are primarily described in relation to a scenario conforming to the mobile communication standard LTE, it will be readily apparent that the technique described herein may also be practiced in context with other error-correcting codes and other applications including storage media such as a hard disc drive.

Those skilled in the art will further appreciate that the methods, steps and functions explained herein may be implemented using individual hardware circuitry, using software functioning in conjunction with a programmed microprocessor or general purpose computer, using an Application Specific Integrated Circuit (ASIC) and/or using one or more Digital Signal Processors (DSPs). It will also be appreciated that while the following embodiments are primarily described in the form of methods, components and devices, the techniques disclosed herein may also be embodied in a computer processor and a memory coupled to the processor, wherein the memory stores one or more programs that perform the steps discussed herein when executed by the processor.

Figure 1:
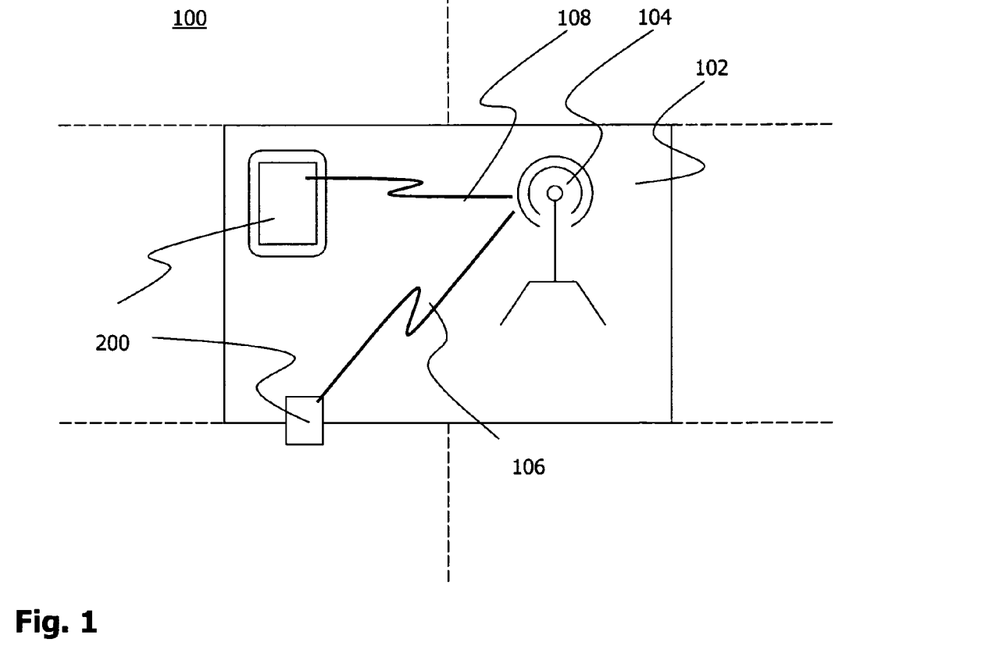

FIG. 1 shows a cellular network 100 dividing service space in a plurality of cells 102. Each cell 102 comprises at least one base station 104 providing for a bidirectional connection (with spatial diversity) to mobile or stationary network components 200.

In LTE, the base station 104 provides to the network component 200 upon entering the cell 102 a Master Information Block (MIB) via a Physical Broadcast Channel (PBCH) 106. The PBCH provides system information, which is transmitted in the form of a tree structure, with the MIB at the "root" of the tree. The MIB contains references to a plurality of system information blocks (not shown). The network component 200 receives and decodes the MIB. The technical specification 3GPP TS 36.331, V8.5.0, specifies spare bits for the MIB (cf. Subsection 6.2.2), which are defined to contain zero values (cf. Subsection 8.4 therein).

Furthermore, the base station 104 repeatedly provides Downlink Control Information (DCI) via a Physical Downlink Control Channel (PDCCH) 108 to the network component 200. The PDCCH carries scheduling information. The DCI can (either) indicate an uplink scheduling grant or a downlink scheduling assignment for both Multiple Input Multiple Output (MIMO) and non-MIMO modes. The DCI also encompasses at least one of a transport format, a retransmission sequence number, a HARQ process number, a number of layers, and precoding information. A size (i.e. a length or a number of bits) of the DCI varies depending on above-mentioned types of information and on system bandwidth.

The LTE standard (cf. Table 5.3.3.1.2-1 in Technical Specification 3GPP TS 36.212) presently requires that certain payload sizes are to be avoided. Moreover, some DCI formats shall be equal in size, such as DCI formats 0 and 1A, or shall have different sizes, such as DCI formats 0 and 1. Filling bits of (a priori) known zero value are appended (to extend) the DCI in order to meet such size constraints. Payload information thus comprises the DCI and the zero-padding bits. An actual payload size is in the range of approximately A=20 bits to A=70 bits per transport block.

The payload information is further protected by a Cyclic Redundancy Check (CRC) of C=16 bits. The CRC is masked (by an exclusive disjunction as a logical or bitwise operation) with a Radio Network Temporary Identity (RNTI, also referred to as User Equipment Identity). The network component 200 decodes the transport block providing information comprising the payload information and the RNTI-masked CRC, derives the RNTI, and decides upon processing the DCI depending on the RNTI.

Figure 2:
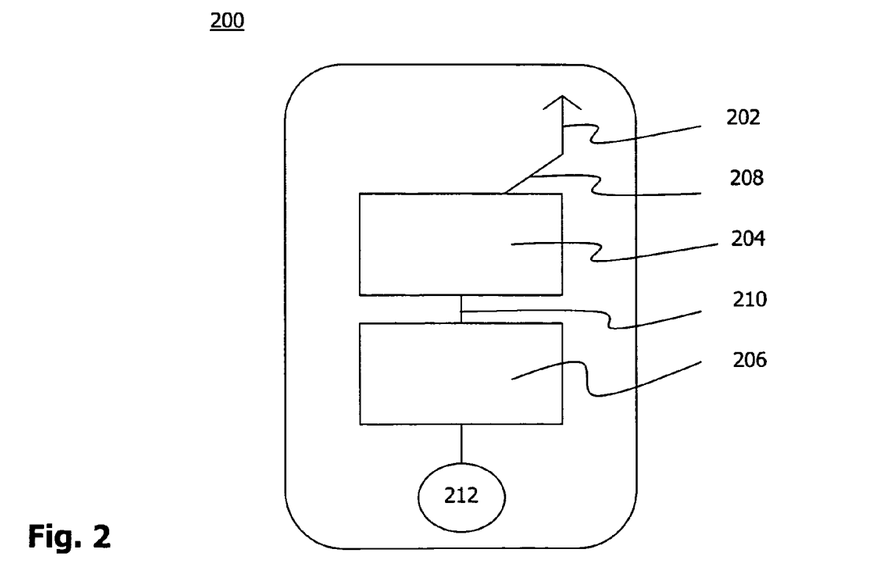
FIG. 2 schematically illustrates a user equipment as the network component embodiment.

FIG. 2 shows in more detail the network component 200. The network component 200 comprises an antenna 202 (or several, typically two, antennas for MIMO modes), a receiver 204, and a decoder 206. The antenna 202 provides to the receiver 204 an analog signal 208 comprising PDCCH data or PBCH data as the payload information. The signal 208 is encoded by a tail-biting convolutional code. I.e., prior to the transmission of the signal 208, the information has been processed by an encoder performing the tail-biting convolutional code. Generally speaking, the convolutional code spreads the information bits (to be transmitted) in the signal 208. Each bit of the information is thus spread over a certain period in time. Signal 208 also includes redundant information for error correction. Denoting the number of information bits by K and the bit length of the transport block (represented by the signal 208) by N, a code rate (of the convolutional code) is $$R = \frac{K}{N} < 1.$$

On the transmitter side (not shown in FIG. 2), an encoder feeds the information bits in a shift register and computes the output of a convolution in each shift step depending on a current state of the register. Assuming the shift register to comprise a cascade of m stages, each of which stores b bits, the number of possible states of the register is $2^{m \cdot b}$. Most frequently, each register stage holds one bit (e.g., in a flip-flop), in which case b=1. In each shift step, a number of c coded stream bits is generated (as one further information bit is fed into the register). Each coded stream bit is part of one of c coded streams, which are represented by a coded stream signal 210 on the receiver side. In each shift step, the convolutional code thus transforms b information bits (typically one bit, b=1) into c transport block bits (typically, c=2, 3, 4, . . . ).

In general, the number K of information bits is K=b·L and the bit length N of the transport block is N=c·L for L shift steps (of the encoder) or L decoding steps (of the decoder), so that the code rate equals $$R = \frac{K}{N} = \frac{b}{c}.$$

In the LTE standard (having b=1 and c=3), the (mother) code rate is thus $$R = \frac{1}{3}.$$

A terminated convolutional code starts from an initial state s=0, and a number of zero-valued bits corresponding to the memory m·b (typically, m) of the register has to be additionally transmitted at the end of each transport block in order to initialize (or reset) the decoder with the zero state (s=0) for a next transport block. A tail-biting convolutional code avoids the additional zero bits at the end of each transport block (and thus avoids the rate loss due to them) by starting the register of the encoder in a tail-biting state s.

In the case of a non-recursive convolutional code, the tail-biting starting state s corresponds to the last m·b bits (i.e., typically m bits) of the information to be transmitted. Other initialization schemes appropriate for encoders utilizing recursive convolutional codes are also known. The register thus starts and ends in the same state. Without the zero-forcing tail of the terminated convolutional code, the tail-biting convolutional code is a block code (as it provides a closed and self-contained transport block). While the tail-biting convolutional code avoids the rate loss of the terminated convolutional code, the tail-biting starting state is unknown for the network component 200. In fact, any one of the $2^{m \cdot b}$ possible states can be the starting (and ending) state of the transport block.

In the present embodiment, and still referring to FIG. 2, the coded stream signal 210 is provided by the receiver 204 to the decoder 206, which performs tail-biting Viterbi decoding in order to arrive at an information signal 212. In a variation of the embodiment, the decoder 206 also processes the signal 208 (or a preprocessed signal derived therefrom).

Figure 3:
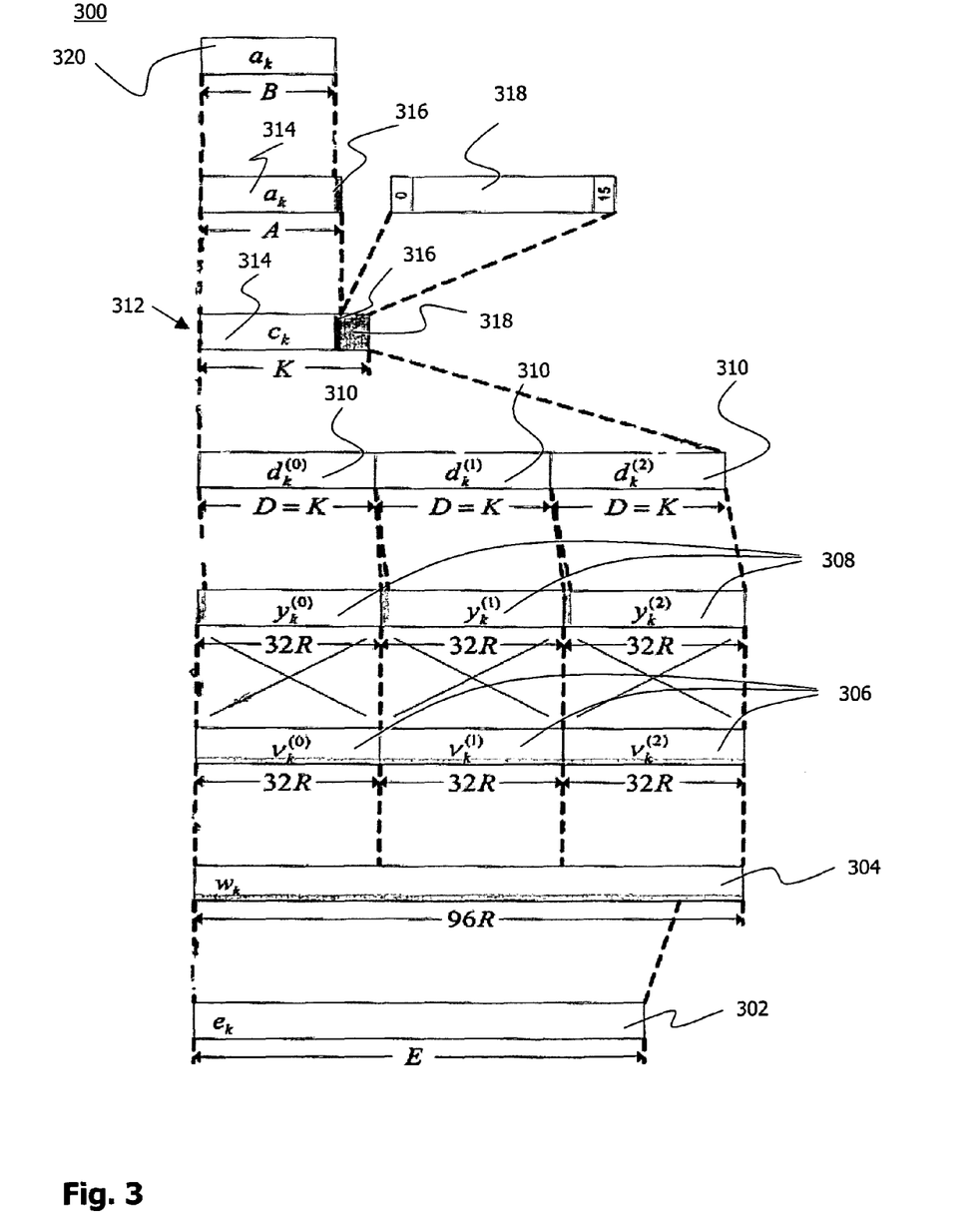
FIG. 3 schematically illustrates data flow for a decoding method embodiment.

FIG. 3 shows in more detail a data flow in the network component 200 for receiving and decoding of the PDCCH data (i.e., the DCI) or the PBCH data (such as the MIB). A rate dematching component (not shown) in the receiver 204 first isolates from the signal 208 a candidate 302 for the transport block on the PBCH 106 or the PDCCH 108. The physical downlink channel candidate 302 comprises a number E of soft (bit) values denoted by $e_k$. At locations of punctured bits, zero values are inserted. The sequence $e_k$ of E soft (bit) values is mapped on a circular buffer 304 comprising 96·R soft (bit) values denoted by $w_k$, wherein $$R = \left\lceil \frac{K}{32} \right\rceil \leq 3.$$

Herein, the E soft (bit) values of the candidate 302 are mapped on the circular buffer 304 by adding up those soft (bit) values $e_k$ in the candidate 302, which are at an equivalent position k modulo 96·R. FIG. 3 shows the case of E<96·R, in which case remaining bits in the circular buffer 304 (at positions E+1 to 96·R) are set to zero. The mapping is also referred to as repetition combining.

The soft (bit) value sequence $w_k$ in the circular buffer 304 is divided into c sub-blocks 306, each having a length of 32·R bits. The number c of sub-blocks corresponds to the number c of coded streams, which is c=3 in the present embodiment. Each soft (bit) value sequence $v_k^{(j)}$ (for j=0, . . . , c−1) of the sub-blocks 306 is de-interleaved to a sequences $y_k^{(j)}$ of equal length 32·R, respectively. A number $N_D$ of dummy bits at the beginning of each de-interleaved sub-block 308 is removed. Here, $N_D$ equals 32·R−K, which is one of 0, . . . , 31. Resulting coded streams 310 have soft (bit) value sequences denoted by $d_k^{(j)}$ (for j=0, . . . , c−1), which are provided by the coded stream signal 210 to the decoder 206 for the tail-biting Viterbi decoding.

The decoder 206 outputs decoded information 312 as a (hard) bit sequence $c_k$ of bit length K represented by the information signal 212. The information 312 comprises in the case of a PDCCH transmission, e.g., 26 to 67 bits for the DCI, or, e.g., 40 bits in the case of PBCH data. The skilled person may readily adapt the number K of information bits to other specification (as possibly stipulated by future standards). The information 312 comprises payload information 314 including filling bits 316 of value zero, followed by the CRC bit field 318 comprising, e.g., C=16 bits. For the DCI, a bit size A of the payload information 314 equals a number B of DCI bits plus the number f of filling bits 316, which ranges, e.g., from f=0 to f=9 bits. The bit size A equals, e.g., 24 bits for the PBCH data.

After verifying of the CRC and removing of the CRC bit field 318, the payload information 314 is obtained as a bit sequence $a_k$. In the case of the PDCCH transmission of the DCI, the padding of zero-valued bits 316 at the end of the payload information 314 is removed. Analogously, the zero-valued spare bits are removed in the case of the PBCH transmission of the MIB (not shown). The number B of remaining information bits 320 is, e.g., in the range of B=10, . . . , 51 bits for the DCI, and, e.g., B=14 bits for the PBCH data.

Figure 4:
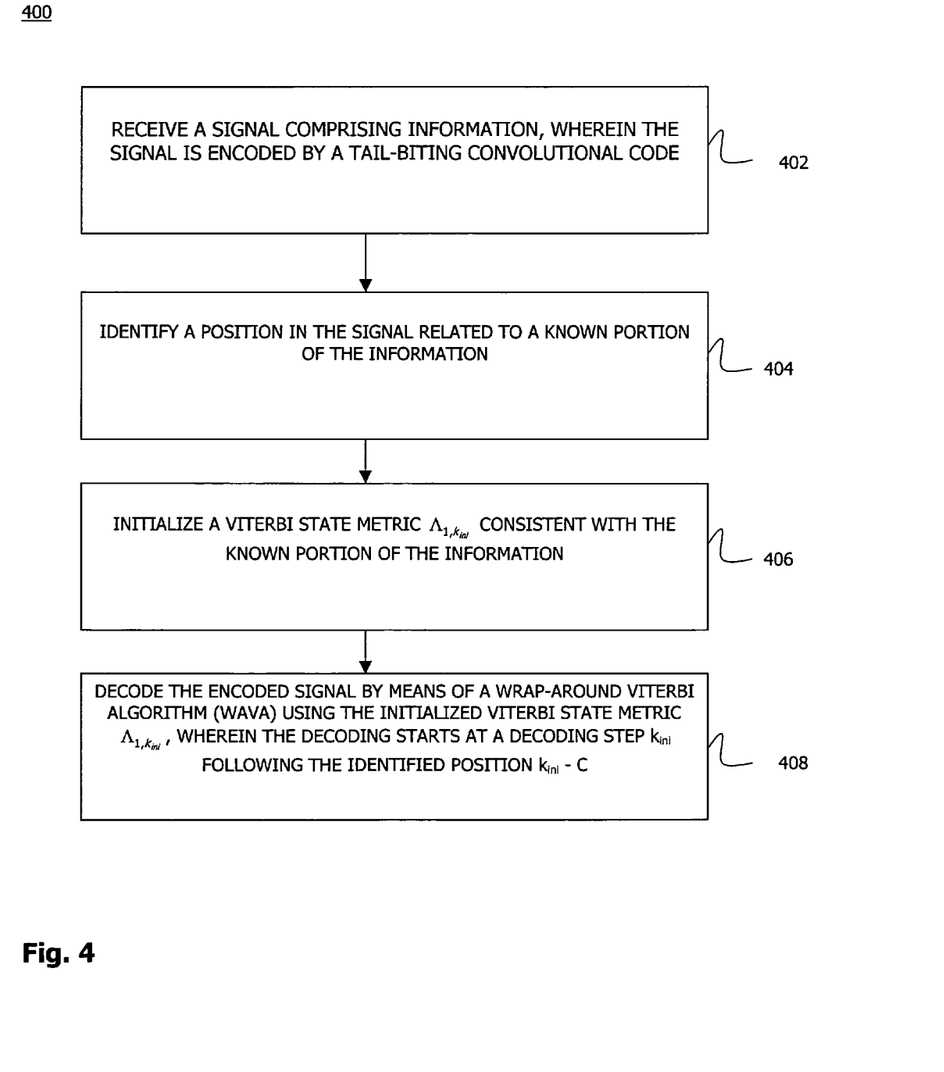
FIG. 4 is a schematic flowchart of the decoding method embodiment.

FIG. 4 shows a method embodiment 400, performed by the network component 200, which can improve the Viterbi decoding of a tail-biting convolutional code. It should be noted that the method embodiment 400 could also be practiced by any apparatus having a configuration different from the configuration of the network component 200.

In step 402, the receiver 204 receives the signal 208 comprising the information 312. The knowledge of the portion 316 comprising the filling bits is used in the decoding. To this end, in step 404, a position is identified in the signal 208, which is represented in the form of the coded streams 310 in the coded stream signal 210. For each coded stream 310, the identified position is associated with the known portion 316 of the information 312.

In step 406, a Viterbi state metric $\Lambda_{i,k}(s)$ is initialized for a first Viterbi iteration, i=1, at an initial position, $k=k_{ini}$. Viterbi state weights of the initial Viterbi state metric $\Lambda_{1,k_{ini}}(s)$ are defined for each of the states s=0, . . . , $2^{m \cdot b}-1$ in consistency with the known portion 316 of the information 312. For the LTE standard b=1 and m=6, so that there are 64 possible states s.

In step 408 the encoded signal 208 is decoded by means of a Wrap-Around Viterbi Algorithm (WAVA) based on the initial Viterbi state metric $\Lambda_{1,k_{ini}}(s)$ by iterating a Viterbi algorithm (for i=1, 2, . . . ). The decoding starts at a starting decoding step at the initial position $k=k_{ini}$ following the identified position. The initial position $k=k_{ini}$ is associated with the first bit following the known portion 316.

The identifying of the position (step 404) and initializing 406 of the initial Viterbi state metric $\Lambda_{1,k_{ini}}(s)$ (step 406) will now described in more detail with reference to the FIGS. 5 and 6.

Figure 5:
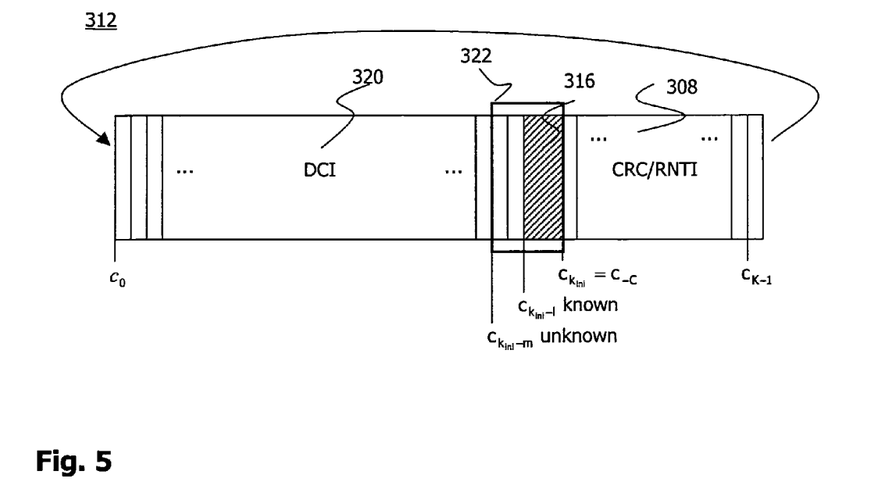
FIG. 5 schematically illustrates information comprising both known information symbols and a plurality of unknown information symbols.

FIG. 5 shows the information 312 in more detail for the case of PDCCH data including the DCI 314. While the DCI 320 as the actual payload information is a priori unknown for the network component 200, the f filling bits 316 have a predetermined value according to the applicable communication standard, which value is zero in the case of the LTE standard. The zero-padding bits 316 are located between the actual payload information bits 320 of the DCI and the bits of the CRC/RNTI 318. The exact location and the value of the f zero-padding bits 316 within the K information bits 312 is thus "known" to the network component 200.

Furthermore, it has to be realized that for decoding a signal 208 encoded by a tail-biting code, the initial position $K_{ini}$ of the decoding can be (cyclically) shifted, and that the initial Viterbi state metric (corresponding to the shifted initial position) can be initialized so to minimize computational complexity of the decoding or to improve a decoding result.

Figure 6:
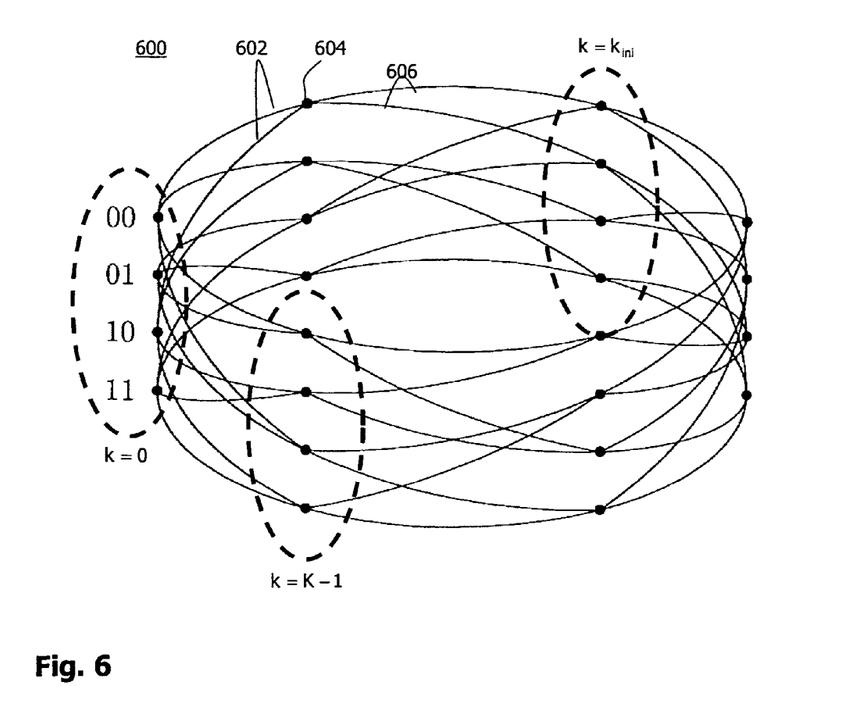
FIG. 6 is a schematic trellis diagram for decoding a signal encoded by a tail-biting convolutional code.

FIG. 6 exemplarily shows an oversimplified tail-biting trellis diagram having four Viterbi states s (with b=1, m=2) and L=K=6 positions. The circular topology of the trellis diagram 600 reflects that the ending Viterbi state metric $\Lambda_{i,K}(s)$ (of any iteration i=1, 2, . . . ) provides an initial condition of a starting Viterbi state metric $\Lambda_{i+1,0}(s)$ for the subsequent Viterbi algorithm (i.e. the subsequent iteration, i+1) in the WAVA.

Several decoding algorithms are known for decoding a signal encoded by a tail-biting convolutional code. The WAVA is generally considered to achieve a decoding performance close to a maximum likelihood estimation (which may be considered a theoretical optimum of the performance). The WAVA is an iteration of the Viterbi algorithm (which is employed once for decoding of terminated convolutional codes), except that the Viterbi state metric $\Lambda_{i,k}(s)$ is conventionally set to zero (or any other constant) for all Viterbi states s in the first updating step, k=0, of the first iteration, i=1. Due to the iterations, computational complexity of the WAVA is relatively high.

A conventional equal probability distribution with all logarithmic probabilities represented by the initial Viterbi state metric $\Lambda_{1,0}(s)$ set to zero or any other common constant reflects the fact that the beginning state k=0 is unknown when decoding a signal encoded by a tail-biting convolutional code. The present embodiment does not base the WAVA decoding on an unknown beginning state.

In the WAVA, the Viterbi algorithm is iterated until a tail-biting condition is fulfilled. The Viterbi algorithm comprises an updating phase and a traceback phase. The updating phase comprises L updating steps k=0, . . . , L−1. In the present embodiment, L equals K as b=1. In the updating step k, the Viterbi state metric $\Lambda_{1,k}(s)$ of the iteration i is updated from position k to position k+1.

The trellis diagram 600 illustrates the updating phase. At each position k, two branches 602 corresponding to a previous updating step k−1 lead to a state 604. Symmetrically, two branches 606 indicate possible transitions (of the updating step k) from the state 604 to other states at a later position k+1. In general, for an encoder having m stages, each of which comprises b bits, $2^b$ branches lead to and branch off from each state s. This topology of transitions reflects the fact that the transitions of the states s are the transitions of a shift register at the encoder.

In each updating step k (for k=0, . . . , L−1), the Viterbi state metric $\Lambda_{i,k}(s'')$ (which is a logarithmic state probability, or a negative logarithm of the state probability depending on the implementation) for a previous state s' (at position k) connected according to the transition topology of the trellis diagram to a state s (at position k+1) is added with a Viterbi branch metric (which is a logarithmic transition probability, or a negative logarithm of the transition probability depending on the implementation) of the connecting branch. The branch (out of the $2^b$ branches leading to the state s) having the highest result (or the lowest result depending on a sign convention of the implementation) is referred to as a survivor branch. Throughout, implementations of the Viterbi state metric and/or the Viterbi branch metric indicating the survivor branch by higher or the highest result are assumed merely for the purpose of exemplification. Its result (i.e., a cumulative metric or the sum of the previous logarithmic state probability $\Lambda_{i,k}(s')$ and the logarithmic transition probability of the survivor branch) is stored as updated Viterbi state metric $\Lambda_{i,k+1) mod K}(s)$. As the updating phase comprises L=K updating steps, the final updating step K−1 yields the final Viterbi state metric $\Lambda_{i,(k+K) mod K}(s)$. (It should be clear that, while the expression (k+K) mod K also evaluates k, the expression is used to indicate the final state after the K updating steps of one round of the WAVA.)

In the traceback phase, the decoder 206 determines the Viterbi state $s_{max}$ having the highest Viterbi state metric value at the final position $(k_{ini}+K)$ mod K. The state $s_{max}$ is also referred to as the maximum likelihood state. The decoder 206 traces back from the final position $(k_{ini}+K)$ mod K and the state $s_{max}$ following the survivor branches. The K (or in general, L) survivor branches correspond to the K information bits 312. The survivor branches leading to the maximum likelihood state $s_{max}$ are collectively referred to as a Viterbi path, which represents the maximum likelihood decoding result of the iteration i.

In case the Viterbi path of the Viterbi iteration i is not a tail-biting path (i.e., the traceback leads at position $k=k_{ini}$ to an initial state $s_{ini}$ different from the final state $s_{max}$ at position $k=(k_{ini}+K)$ mod K) the path is discarded. The final Viterbi state metric $\Lambda_{i,(k_{ini}+K)modK}(s)$ defines the initial Viterbi state metric $\Lambda_{i+1,k_{ini}}(s)$ for a further iteration, i+1, of the Viterbi algorithm.

In case the tail-biting condition is fulfilled, (i.e., the traceback leads at position $k=k_{ini}$ to an initial state $s_{ini}$ equal to the final state $s_{max}$ at position $k=(k_{ini}+K)$mod K), the WAVA ends. Otherwise, there will be further iterations of the Viterbi algorithm until either the tail-biting condition is fulfilled (as described above), or until a predefined maximum number $I_{max}$ of iterations i have passed.

As a consequence of the usually high number of iterations i, the computational effort of the WAVA is many times higher compared to the single Viterbi algorithm for terminated convolutional code. Furthermore, the effort for tracing back the survivor branches is substantially higher for tail-biting convolutional codes (64 times) than for terminated convolutional codes (1 time), depending on a memory keeping track of the originating states for each survivor branch. Furthermore, even after performing the $I_{max}$ iterations of the Viterbi algorithm, the traceback may result in a Viterbi path not fulfilling the tail-biting condition (resulting in the loss of the transport block and the information 312 contained therein).

As opposed to the legacy procedure originating from terminated convolutional codes, the decoding of the signal 208 encoded by a tail-biting convolutional code can start as well from any other initial position $k_{ini}$ other than the initial position, k=0, which is used by the encoder on the transmitter side and for the transmission as a starting position. For one transport block, at least one of the signal 208, soft (bit) values representative of the signal 208, the coded stream signal 210, and the coded streams 310 are stored in a circular buffer. For initializing the WAVA it is sufficient to initialize the initial Viterbi state metric $\Lambda_{1,k_{ini}}(s)$ (as described herein) and to set a buffer pointer of the updating step to $k_{ini}$. Whenever there is in the information 312 a sequence of m·b bits (wherein in the LTE standard b=1) comprising l known bits, the initial position $k_{ini}$ and the initial Viterbi state metric $\Lambda_{1,k_{ini}}(s)$ are defined to improve the decoding performance based on the l known bits.

The initial position $k_{ini}$ is defined so that the sequence of m (in general, m·b) bits in the information 312 before the initial position $k_{ini}$ includes the l known bits (or as many known bits as possible). Here, "before" is to be understood in the sense of "before" in the decoding direction or in the sense of lower bit values. In other words, a window 322 of bit length m (in general, m·b) is positioned onto the bit sequence $c_k$ of the information 312, such that all l known bits (or as many known bits as possible) fall within the window. Thereby, the bit sequence $c_k$ of the information 312 is to be considered as a cyclic bit sequence $C_{kmodK}$, such that any one of the K bit positions (denoted by k modulo K which is one of 0, ..., K-1) can be defined as the initial position $k_{ini}$. The initial position $K_{ini}$ immediately follows (i.e., is the next bit "after") the window 322 comprising the information bits $C_{kmodK}$ with $k=k_{ini}-m$ to $k=k_{ini}-1$. The information bits $C_{kmodK}$ within the window 322 at least partially define the initial Viterbi state metric $\Lambda_{1,k_{ini}}(s)$. Furthermore, the last m (in general m·b) bits "before" the initial position $k_{ini}$ define the initial Viterbi state metric $\Lambda_{1,k_{ini}}(s)$, such that states contradicting the l known bits within the window 322 are excluded.

In the case of a consecutive sequence of l known bits within the information 312, a convenient choice of the initial position $k_{ini}$ immediately follows the l known bits $c_{k_{ini}-l}, \ldots, c_{k_{ini}-1}$ as illustrated for the DCI information 320 in FIG. 5. In a variation of the embodiment, the window 322 comprises the l known bits (in the case of l<m) at any other position than (exclusively) the last l positions ($c_{k_{ini}-l}, \ldots, c_{k_{ini}-1}$). Particularly, the initial position $k_{ini}$ is alternatively chosen such that the known bits are the first l bits ($c_{k_{ini}-m}, \ldots, c_{k_{ini}-1-m+1}$) within the window 322.

In case the length l of the consecutive sequence is equal to or larger than the memory m of the convolutional code, the initial state $s_{ini}$ is completely known (and a single Viterbi algorithm is sufficient for decoding the signal 208). Otherwise, the possible number of valid initial states (for the tail-biting convolutional code) is exponentially decreased from $2^{b \cdot m}$ to $2^{b(m-l)}$ (wherein in the case of the LTE standard b=1) by excluding those states inconsistent with the l known bits (with l<m).

In the case of the DCI of the LTE standard, the initial position $k_{ini}$ is (cyclically) offset by $-C=-16$ decoding steps for each iteration i of the Viterbi algorithm ($K_{ini}=-C$ mod K).

In the case of l>m, one specific branch hypothesis can be declared as a priori invalid (out of the $2^b$ branches leading to a state s) in each updating phase of the WAVA within the last l updating steps (i.e., the updating steps $k_{ini}-l$ to $k_{ini}-1$ towards the end of the updating phase of the iteration i).

A "consistent" initial Viterbi state metric $\Lambda_{1,k_{ini}}(s)$ is any appropriate (Viterbi) metric assigning Viterbi weights (or costs) to the initial states that s suppress those states that contradict the l known bits. The initial Viterbi state metric $\Lambda_{1,k_{ini}}(s)$ can be constructed using a knowledge bit mask M defined by:

$$M = \sum_{n=0}^{m-1} 2^{b \cdot n} \cdot \begin{cases} 2^b - 1, & \text{if } c_{k_{ini}-n-1} \text{ known} \\ 0, & \text{if } c_{k_{ini}-n-1} \text{ unknown} \end{cases}; \quad M \in \{0, \ldots, 2^{mb}-1\}.$$

The knowledge mask M allows to isolate known bits in the window 322 in order to check for consistency with a reference state $s_{ref}$ comprising the values of the k known bits:

$$s_{ref} = \sum_{n=0}^{m-1} 2^{b \cdot n} \cdot \begin{cases} c_{k_{ini}-n-1}, & \text{if } c_{k_{ini}-n-1} \text{ known} \\ 0, & \text{if } c_{k_{ini}-n-1} \text{ unknown.} \end{cases}$$

The initial Viterbi state metric is then defined by:

$$\Lambda_{1,k_{ini}}(s) = \begin{cases} 0, & \text{if } (s \text{ AND } M) = s_{ref} \\ -\infty, & \text{if } (s \text{ AND } M) \neq s_{ref}, \end{cases}$$

wherein "AND" denotes the logical (bitwise) conjunction operation.

In practice, any comparatively small (particularly negative) metric value (besides above-indicated negative infinity) is also appropriate for suppressing the inconsistent Viterbi states.

In the context of the PDCCH transmission, typical values for the number l of known bits is on the order of 0, 1, or 2. This is due to the fact that certain payload sizes and/or DCI formats are excluded or prescribed by the LTE standard as mentioned above. Larger values of 1 up to 9 are also possible. Such high values of L are unlikely in the context of the DCI and only occur for asymmetrical LTE cell bandwidth parameters.

In the context of the PBCH transmission, above-mentioned LTE standard (3GPP TS 36.331, V 8.5.0) specifies a number of l=10 spare bits for the MIB (in Subsection 6.2.2) with value zero (pursuant to Subsection 8.4).

It is emphasized that above technique is not limited to a certain bit value (such as zero) of the l known bits. Furthermore, the l known bits are not required to occur consecutively in the information 312. Rather, any number of known bits and any bit pattern covered by a state (such as the m bits corresponding to the memory of the tail-biting convolutional code) exponentially limit the number of valid initial states. In the case of a recursive convolutional code, known bits are spread in the information 312 over a bit sequence even longer than the memory m and can enter the initialization of the Viterbi state metric. Moreover, the initial Viterbi state metric is not limited to represent a uniform probability distribution in the set of consistent initial states. Rather, any other Viterbi weights can be assigned to the states consistent with the a priori known bits. In a variation, these Viterbi weights also account for further a priori knowledge (besides definitions of the communication standard) such as the information 312 comprising an expected response.

But virtue of the above embodiments, decoding losses caused by failing to find the correct tail-biting state are reduced or even completely avoided. Particularly for the decoding of control and broadcast channels in LTE, namely PDCCH and PBCH, the decoding performance is improved by using a priori information about payload information bits that are encoded in the signal 208. The performance improvement includes higher transmission rates for a given signal-to-noise ratio and a faster convergence to the tail-biting state. This reduces computational complexity and can reduce power requirements for the network component 200.

While all embodiments described herein refer to the case of data transmission from the base station 104 to the network component 200, the technique disclosed herein also applies to uplink data transmission.

In the foregoing, principles, preferred embodiments and various modes of implementing the technique disclosed herein have exemplarily been described. However, the present invention should not be construed as being limited to the particular principles, embodiments and modes discussed above. Rather, it will be appreciated that variations and modifications may be made by a person skilled in the art without departing from the scope of the present invention as defined in the following claims.

The invention claimed is:

1. A method of decoding a signal in a communication network, the method comprising:
receiving a signal comprising information, wherein the signal is encoded by a tail-biting convolutional code;
identifying a position in the signal related to a known portion of the information, wherein the known portion of the information includes a subset of a bit string of the information, wherein a length of the bit string is equal to or shorter than a memory of the convolutional code;
initializing a Viterbi state metric consistent with the known portion of the information by assigning, to initial Viterbi states consistent with the known portion of the information, Viterbi weights that also account for further a-priori knowledge about additional information besides the known portion of the information, the additional information comprising an expected response; and
decoding the encoded signal by means of a Wrap-Around Viterbi Algorithm (WAVA) using the initialized Viterbi state metric, wherein the decoding starts at a decoding step following the identified position.

2. The method of claim 1, wherein the initialized Viterbi state metric excludes one or more initial Viterbi states inconsistent with the known portion of the information.

3. The method of claim 1, wherein the decoding the encoded signal further comprises repeating the WAVA until a terminating condition is fulfilled.

4. The method of claim 3, wherein an initial Viterbi state metric of a repeated WAVA equals a final Viterbi state metric of a previous WAVA.

5. The method of claim 4, wherein the terminating condition comprises a tail-biting condition requiring, for the terminating WAVA, that a maximum likelihood states of the initial Viterbi state metric equals a maximum likelihood states of the final Viterbi state metric.

6. The method of claim 5, wherein the terminating condition further requires the maximum likelihood states of at least one of the initialized Viterbi state metrics and the final Viterbi state metric to be consistent with the known portion of the information.

7. The method of claim 5, further comprising determining the maximum likelihood states of at least one of the initialized Viterbi state metrics and the final Viterbi state metric by only considering the Viterbi states consistent with the known portion of the information when determining the maximum likelihood states of at least one of the initialized Viterbi state metrics and the final Viterbi state metric.

8. The method of claim 3, wherein the termination condition comprises a predefined maximum number of repetitions.

9. The method of claim 8:
wherein decoding the encoded signal comprises decoding the encoded signal based on a maximum likelihood states of the final Viterbi state metric of the terminating WAVA;
wherein a determination of the maximum likelihood states only considers the Viterbi states consistent with the known portion of the information.

10. A computer program product stored in a non-transitory computer readable medium for controlling a decoding of a signal in a communications network, the computer program product comprising software instructions which, when run on one or more computing devices, causes the one or more computing devices to:
receive a signal comprising information, wherein the signal is encoded by a tail-biting convolutional code;
identify a position in the signal related to a known portion of the information, wherein the known portion of the information includes a subset of a bit string of the information, wherein a length of the bit string is equal to or shorter than a memory of the convolutional code;
initialize a Viterbi state metric consistent with the known portion of the information by assigning, to initial Viterbi states consistent with the known portion of the information, Viterbi weights that also account for further a-priori knowledge about additional information besides the known portion of the information, the additional information comprising an expected response; and
decode the encoded signal by means of a Wrap-Around Viterbi Algorithm (WAVA) using the initialized Viterbi state metric, wherein the decoding starts at a decoding step following the identified position.

11. An apparatus for decoding a signal in a communication network, the apparatus comprising:
- a receiver adapted to receive a signal comprising information, wherein the signal is encoded by a tail-biting convolutional code; and
- a decoder configured to:
  - identify a position in the signal related to a known portion of the information, wherein the known portion of the information includes a subset of a bit string of the information, wherein a length of the bit string is equal to or shorter than a memory of the convolutional code;
  - initialize a Viterbi state metric consistent with the known portion of the information by assigning, to initial Viterbi states consistent with the known portion of the information, Viterbi weights that also account for further a-priori knowledge about additional information besides the known portion of the information, the additional information comprising an expected response; and
  - decode the encoded signal by means of a Wrap-Around Viterbi Algorithm (WAVA) using the initialized Viterbi state metric, wherein the decoding starts at a decoding step following the identified position.

12. The apparatus of claim 11, wherein the initialized Viterbi state metric excludes one or more initial Viterbi states inconsistent with the known portion of the information.

* * * * *